(12) United States Patent
Mase et al.

(10) Patent No.: US 8,653,619 B2
(45) Date of Patent: Feb. 18, 2014

(54) RANGE SENSOR AND RANGE IMAGE SENSOR

(75) Inventors: Mitsuhito Mase, Hamamatsu (JP);
Takashi Suzuki, Hamamatsu (JP);
Tomohiro Yamazaki, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/487,514

(22) Filed: Jun. 4, 2012

(65) Prior Publication Data

US 2012/0235272 A1 Sep. 20, 2012

Related U.S. Application Data

(63) Continuation of application No. 13/498,202, filed as application No. PCT/JP2010/070564 on Nov. 18, 2010.

(30) Foreign Application Priority Data

Nov. 30, 2009 (JP) ................................. P2009-271825

(51) Int. Cl.
*H01L 31/0224* (2006.01)
*H01L 27/146* (2006.01)
(52) U.S. Cl.
USPC .................................. 257/448; 257/E31.124
(58) Field of Classification Search
USPC ................................. 257/183.1, 448, E31.124
See application file for complete search history.

(56) References Cited

U.S. PATENT DOCUMENTS

| 4,498,013 | A | 2/1985 | Kuroda et al. |
|---|---|---|---|
| 5,438,211 | A | 8/1995 | Nakamura et al. |
| 6,765,246 | B2 | 7/2004 | Inagaki |
| 6,927,091 | B2 | 8/2005 | Harada |
| 7,352,454 | B2 | 4/2008 | Bamji et al. |
| 2001/0040210 | A1 | 11/2001 | Nagata |

FOREIGN PATENT DOCUMENTS

| JP | 2005-268814 | 9/2005 |
|---|---|---|
| JP | 2007-526448 | 9/2007 |
| JP | 2009-14461 | 1/2009 |
| WO | WO 2009/005098 | 1/2009 |
| WO | 2009/139312 | 11/2009 |

*Primary Examiner* — William D Coleman
(74) *Attorney, Agent, or Firm* — Drinker Biddle & Reath LLP

(57) ABSTRACT

A range image sensor 1 is provided with a semiconductor substrate 1A having a light incident surface 1BK and a surface 1FT opposite to the light incident surface 1BK, a photogate electrode PG, first and second gate electrodes TX1, TX2, first and second semiconductor regions FD1, FD2, and a third semiconductor region SR1. The photogate electrode PG is provided on the surface 1FT. The first and second gate electrodes TX1, TX2 are provided next to the photogate electrode PG. The first and second semiconductor regions FD1, FD2 accumulate respective charges flowing into regions immediately below the respective gate electrodes TX1, TX2. The third semiconductor region SR1 is located away from the first and second semiconductor regions FD1, FD2 and on the light incident surface 1BK side and has the conductivity type opposite to that of the first and second semiconductor regions FD1, FD2.

5 Claims, 15 Drawing Sheets (a)

(b)

(a)

(b)

RANGE SENSOR AND RANGE IMAGE SENSOR

This is a continuation application of copending application Ser. No. 13/498,202, having a §371 date of Mar. 26, 2012, which is a national stage filing based on PCT International Application No. PCT/JP2010/070564, filed on Nov. 18, 2010. The copending application Ser. No. 13/498,202 is incorporated by reference herein in its entirety.

TECHNICAL FIELD

The present invention relates to a range sensor and a range image sensor.

BACKGROUND ART

A conventional active type optical distance measuring sensor is known as a device configured to irradiate light from a light source for projection of light such as an LED (Light Emitting Diode) toward an object, to detect reflected light from the object with a photodetecting element, and thereby to output a signal according to the distance to the object. For example, a PSD (Position Sensitive Detector) is known as an optical distance measuring sensor of an optical triangulation type capable of readily measuring the distance to the object, and in recent years there are expectations for development of an optical distance measuring sensor of an optical TOF (Time-Of-Flight) type, in order to achieve more accurate distance measurement.

There are demands for an image sensor capable of simultaneously acquiring distance information and image information by a single chip, for example, in on-vehicle use, use in automatic manufacture systems in factories, and so on. With the image sensor being installed in the front portion of a vehicle, its expected use is to detect and recognize a preceding vehicle or to detect and recognize a pedestrian or the like. There are also expectations for an image sensor capable of acquiring a range image consisting of a single piece of distance information or multiple pieces of distance information, separately from the image information. It is preferable to apply the TOF method to such a distance measuring sensor.

In the TOF method, pulsed light is emitted from a light source for projection of light toward an object and the pulsed light reflected by the object is detected by a photodetecting element to measure a time difference between the emission timing and the detection timing of pulsed light. This time difference ($\Delta t$) is a time for the pulsed light to travel a distance ($2\times d$) twice as long as the distance d to the object, at the speed of light ($=c$), and therefore the relation of $d=(c\times\Delta t)/2$ holds. The time difference ($\Delta t$) can be translated into a phase difference between pulses emitted from the light source and detected pulses. The distance d to the object can be obtained by detecting the phase difference.

An image sensor of a charge distribution type has been attracting attention as a photodetection element for distance measurement by the TOF method. Specifically, the image sensor of the charge distribution type is configured, for example, to distribute a charge generated in the image sensor according to incidence of a detected pulse into one potential well during an ON duration of an emitted pulse and into the other potential well during an OFF duration. In this case, a ratio of charge quantities distributed right and left is proportional to the phase difference between the detected pulse and the emitted pulse, i.e., the time necessary for the pulsed light to travel the distance twice as long as the distance to the object at the speed of light. There are various conceivable methods of the charge distribution type.

Patent Literature 1 discloses the range sensor (range image sensor) of the charge distribution method, which comprises a semiconductor substrate, a photogate electrode provided on a surface of the semiconductor substrate and having a planar shape with two sides opposed to each other, a plurality of gate electrodes provided respectively next to two sides of the photogate electrode on the surface, and a plurality of semiconductor regions having the conductivity type different from that of the semiconductor substrate and provided for reading out respective charges flowing from a region immediately below the photogate electrode into regions immediately below the respective gate electrodes.

CITATION LIST

Patent Literature

Patent Literature 1: Published Japanese Translation of PCT Application No. 2007-526448

SUMMARY OF INVENTION

Technical Problem

In the range sensor (range image sensor) of the charge distribution method as described above, a bias voltage (e.g., 5 V) is applied to each semiconductor region, in order to reset the region prior to the distance measurement. At this time, depletion layers spread not only from the region immediately below the photogate electrode, but also from each of the semiconductor regions. If the depletion layers spread from the respective semiconductor regions, the generated charge can be directly taken into the depletion layers spreading from the respective semiconductor regions, without being taken into the depletion layer spreading from the region immediately below the photogate electrode. In the range sensor (range image sensor) of the charge distribution method, signals based on the charge reaching the region immediately below the photogate electrode and distributed by the gate electrodes contribute to the distance information. For this reason, the charge directly taken into the depletion layers spreading from the respective semiconductor regions and accumulated in the semiconductor regions becomes an unwanted noise component (DC component).

It is an object of the present invention to provide a range sensor and a range image sensor capable of performing highly accurate distance detection, while suppressing generation of the unwanted noise component.

Solution to Problem

A range sensor according to the present invention is a range sensor comprising: a semiconductor substrate having a light incident surface and a surface opposite to the light incident surface; a photogate electrode provided on the surface; first and second gate electrodes provided next to the photogate electrode on the surface; first and second semiconductor regions for readout of respective charges flowing from a region immediately below the photogate electrode to immediately below the first and second gate electrodes; and a third semiconductor region located away from the first and second semiconductor regions and on the light incident surface side and having a conductivity type opposite to that of the first and second semiconductor regions.

In the range sensor according to the present invention, the third semiconductor region of the conductivity type opposite to that of the first and second semiconductor regions is located away from the first and second semiconductor regions and on the light incident surface side. For this reason, the depletion layers spreading from the first and second semiconductor regions are prevented from spreading toward the light incident surface by the third semiconductor region, whereby the depletion layers are kept from extending over the third semiconductor region toward the light incident surface. As a consequence, the generated charge is prevented from being directly taken into the depletion layers spreading from the first and second semiconductor regions, so as to suppress the generation of the unwanted noise component.

The depletion layer spreading from the region immediately below the photogate electrode spreads toward the light incident surface, without being prevented from spreading by the third semiconductor region. Therefore, the third semiconductor region does not hinder the capture of the charge into the depletion layer spreading from the region immediately below the photogate electrode. Since the third semiconductor region is located away from the first and second semiconductor regions, no barrier is formed in a potential slope from the region immediately below the photogate electrode to the regions immediately below the first and second semiconductor regions, so as to produce no hindrance to transfer of charge.

A range image sensor according to the present invention is a range image sensor comprising an imaging region consisting of a plurality of units arranged in a one-dimensional or two-dimensional pattern, on a semiconductor substrate and configured to obtain a range image, based on charge quantities output from the units, wherein one unit is the aforementioned range sensor. In the present invention, the generated charge is prevented from being directly taken into the depletion layers spreading from the first and second semiconductor regions, as described above, so as to suppress the generation of the unwanted noise component.

The first and second gate electrodes may be provided around the perimeter of the first and second semiconductor regions, respectively, so as to surround the first and second semiconductor regions. In this case, the first and second gate electrodes are located around the first and second semiconductor regions and on the contrary, the first and second semiconductor regions are also located around the first and second gate electrodes. Since the first and second gate electrodes surround the first and second semiconductor regions, charge from all directions can be transferred to the first and second semiconductor regions, by supplying a signal for transfer of charge to the first and second gate electrodes. Namely, substantially entire regions around the first and second gate electrodes can be made to function as charge generation regions, which remarkably improves an aperture ratio. Therefore, signal amounts increase so as to provide a range image with a high S/N ratio. With focus on one range sensor, charge is transferred from all directions outside the first and second gate electrodes to the inside first and second semiconductor regions, and therefore large quantities of charge can be collected. When the distance is determined based on such charge, we can obtain a distance output with a high S/N ratio.

The first and second gate electrodes may have a ring shape. In this case, it becomes feasible to securely collect the charge flowing from all directions into the regions immediately below the first and second gate electrodes and to prevent inflow thereof.

Advantageous Effects of Invention

The present invention provides the range sensor and the range image sensor capable of performing highly accurate distance detection, while suppressing the generation of the unwanted noise component.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
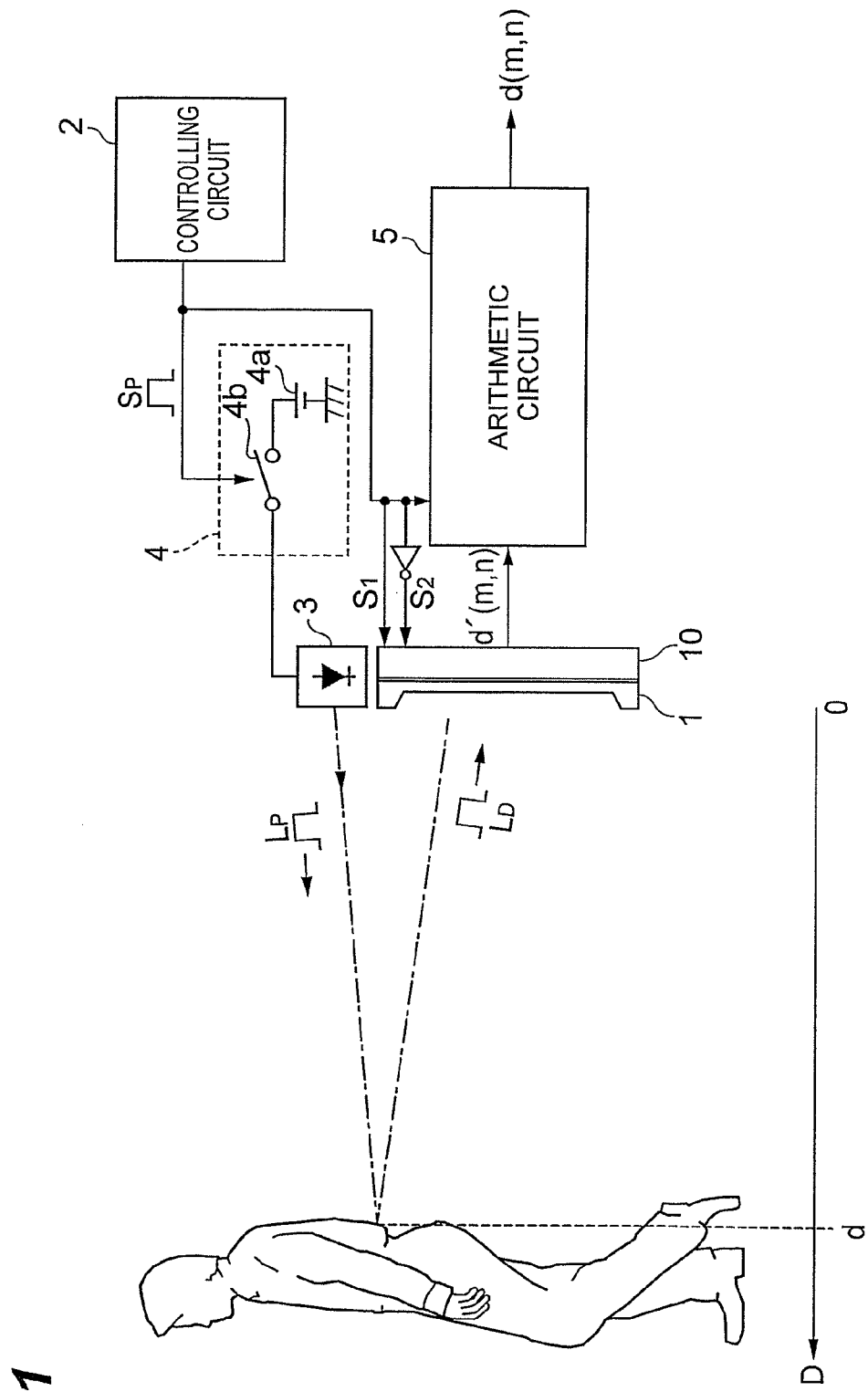
FIG. 1 is an explanatory drawing showing a configuration of a distance measuring device according to an embodiment of the present invention.

FIG. 1 is an explanatory drawing showing a configuration of a distance measuring device.

This distance measuring device is provided with a range image sensor 1, a light source 3 to emit near-infrared light, a driving circuit 4 to supply a pulse drive signal SP to the light source 3, a controlling circuit 2, and an arithmetic circuit 5. The controlling circuit 2 supplies detection gate signals S1, S2 in synchronism with the pulse drive signal SP to first and second gate electrodes (TX1, TX2: cf. FIG. 4) in each pixel of the range image sensor 1. The arithmetic circuit 5 calculates a distance to an object H such as a pedestrian, from a signal d'(m,n) indicative of distance information read out from first and second semiconductor regions (FD1, FD2: cf. FIG. 4) of the range image sensor 1. The distance in the horizontal direction D from the range image sensor 1 to the object H is represented by d.

The controlling circuit 2 feeds the pulse drive signal $S_P$ to a switch 4b of the driving circuit 4. The light source 3 for projection of light consisting of an LED or a laser diode is connected via the switch 4b to a power supply 4a. Therefore, when the pulse drive signal $S_P$ is fed to the switch 4b, a drive current of the same waveform as the pulse drive signal $S_P$ is supplied to the light source 3 and the light source 3 outputs pulsed light $L_P$ as probe light for distance measurement.

When the pulsed light $L_P$ is irradiated on the object H, the object H reflects the pulsed light. Then the reflected light is incident as pulsed light $L_D$ into the range image sensor 1 and the range image sensor 1 outputs a pulse detection signal $S_D$.

The range image sensor 1 is fixed on a wiring board 10. In the range image sensor 1, a signal d'(m,n) having distance information is output from each pixel through wiring on the wiring board 10.

The waveform of the pulse drive signal $S_P$ is a rectangular wave with the period T and the voltage V(t) thereof is given by the following formulae, where "1" represents a high level and "0" a low level. Pulse drive signal $S_P$:

$V(t)=1$ (in the case of $0<t<(T/2)$);

$V(t)=0$ (in the case of $(T/2)<t<T$);

$V(t+T)=V(t)$.

The waveforms of the detection gate signals $S_1$, $S_2$ are rectangular waves with the period T and the voltage V(t) thereof is given by the following formulae.
Detection gate signal $S_1$:

$V(t)=1$ (in the case of $0<t<(T/2)$);

$V(t)=0$ (in the case of $(T/2)<t<T$);

$V(t+T)=V(t)$.

Detection gate signal $S_2$ (=inversion of $S_1$):

$V(t)=0$ (in the case of $0<t<(T/2)$);

$V(t)=1$ (in the case of $(T/2)<t<T$);

$V(t+T)=V(t)$.

The foregoing pulse signals $S_P$, $S_1$, $S_2$, $S_D$ all have the pulse period $2 \times T_P$. Let Q1 be a charge quantity generated in the range image sensor 1 with the detection gate signal $S_1$ and the pulse detection signal $S_D$ both being "1," and Q2 be a charge quantity generated in the range image sensor 1 with the detection gate signal $S_2$ and the pulse detection signal $S_D$ both being "1."

A phase difference between one detection gate signal $S_1$ and the pulse detection signal $S_D$ in the range image sensor 1 is proportional to the charge quantity Q2 generated in the range image sensor 1, in an overlap duration in which the other detection gate signal $S_2$ and the pulse detection signal $S_D$ are "1." Namely, the charge quantity Q2 is a charge quantity generated in the duration in which AND of the detection gate signal $S_2$ and the pulse detection signal $S_D$ is "1." When a total charge quantity generated in one pixel is Q1+Q2 and the pulse width of a half period of the drive signal $S_P$ is $T_P$, the pulse detection signal $S_D$ lags behind the drive signal $S_P$ by a time of $\Delta t = T_P \times Q2/(Q1+Q2)$. The time of flight $\Delta t$ of one light pulse is given by $\Delta t = 2d/c$, where d is the distance to the object and c the speed of light. For this reason, when two charge quantities (Q1,Q2) are output as signal d' having the distance information from a specific pixel, the arithmetic circuit 5 calculates the distance $d=(c \times \Delta t)/2=c \times T_P \times Q2/(2 \times (Q1+Q2))$ to the object H, based on the input charge quantities Q1, Q2 and the known half-period pulse width $T_P$.

As described above, the arithmetic circuit 5 can calculate the distance d by separately reading out the charge quantities Q1, Q2. The foregoing pulses are repeatedly emitted and integral values thereof can be output as respective charge quantities Q1, Q2.

The ratio to the total charge quantity of the charge quantities Q1, Q2 corresponds to the aforementioned phase difference, i.e., to the distance to the object H. The arithmetic circuit 5 calculates the distance to the object H according to this phase difference. As described above, when the time difference corresponding to the phase difference is represented by $\Delta t$, the distance d is preferably given by $d=(c \times \Delta t)/2$, but an appropriate correction operation may be performed in addition thereto. For example, if an actual distance is different from the calculated distance d, a factor $\beta$ to correct the latter is preliminarily obtained and the finally calculated distance d is obtained by multiplying the factor $\beta$ to the calculated distance d in a product after shipped. Another available correction is such that the outside temperature is measured, an operation to correct the speed of light c is performed if the speed of light c differs depending upon the outside temperature, and then the distance calculation is performed. It is also possible to preliminarily store in a memory a relation between signals input into the arithmetic circuit and actual distances, and determine the distance by a lookup table method. The calculation method can be modified depending upon the sensor structure and the conventionally known calculation methods can be applied thereto.

Figure 2:
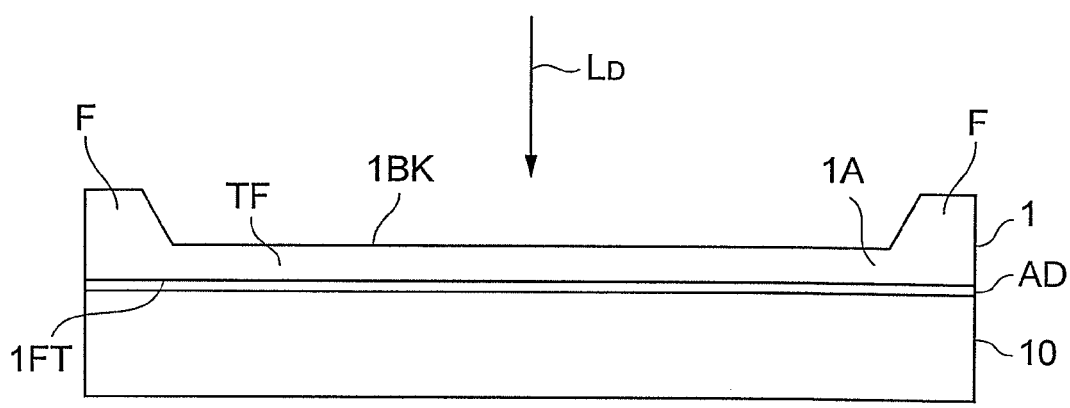
FIG. 2 is a drawing for explaining a cross-sectional configuration of a range image sensor.

FIG. 2 is a drawing for explaining a cross-sectional configuration of the range image sensor.

The range image sensor 1 has a semiconductor substrate 1A. The semiconductor substrate 1A has a frame portion F for reinforcement, and a thin plate portion TF thinner than the frame portion F, which are integrated with each other. The thickness of the thin plate portion TF is not less than 5 μm and not more than 100 μm. The thickness of the frame portion F in the present example is not less than 200 μm and not more than 600 μm. The semiconductor substrate 1A may be thinned throughout the entire area. The pulsed light $L_D$ is incident through a light incident surface 1BK into the range image sensor 1. A surface 1FT opposite to the light incident surface 1BK of the range image sensor 1 is connected through an adhesive region AD to the wiring board 10. The adhesive region AD is a region including adhesive elements such as bump electrodes and contains an insulating adhesive and/or a filler as needed.

Figure 3:
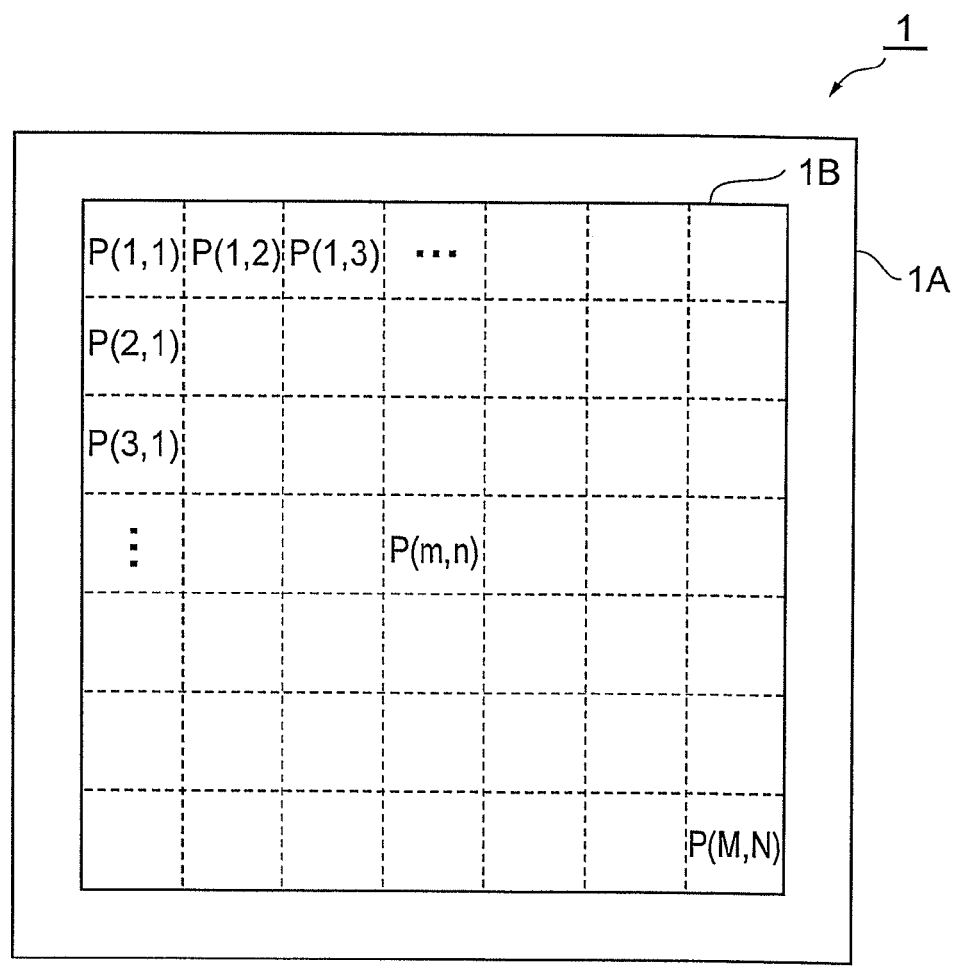
FIG. 3 is a schematic plan view of the range image sensor.

FIG. 3 is a schematic plan view of the range image sensor.

In the range image sensor 1, the semiconductor substrate 1A has an imaging region 1B consisting of a plurality of pixels P(m,n) arrayed in a two-dimensional pattern. Each pixel P(m,n) outputs two charge quantities (Q1,Q2) as the aforementioned signal d'(m,n) having the distance information. Each pixel P(m,n) functions as a microscopic distance measuring sensor to output the signal d'(m,n) according to the distance to the object H. Therefore, when the reflected light from the object H is focused on the imaging region 1B, we can obtain a range image of the object as a collection of distance information to respective points on the object H. One pixel P(m,n) functions as one range sensor.

Figure 4:
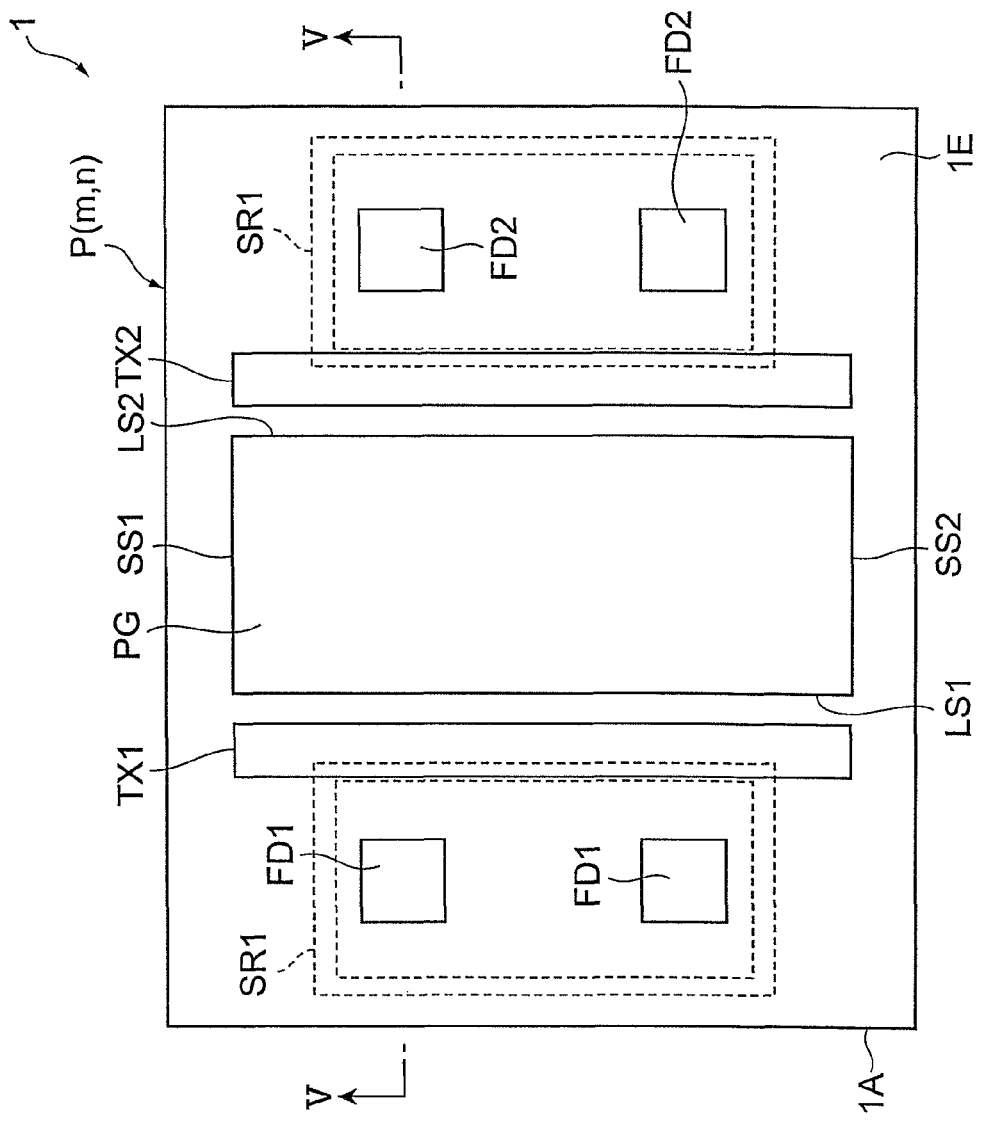
FIG. 4 is a schematic drawing for explaining a configuration of a pixel in the range image sensor.
Figure 5:
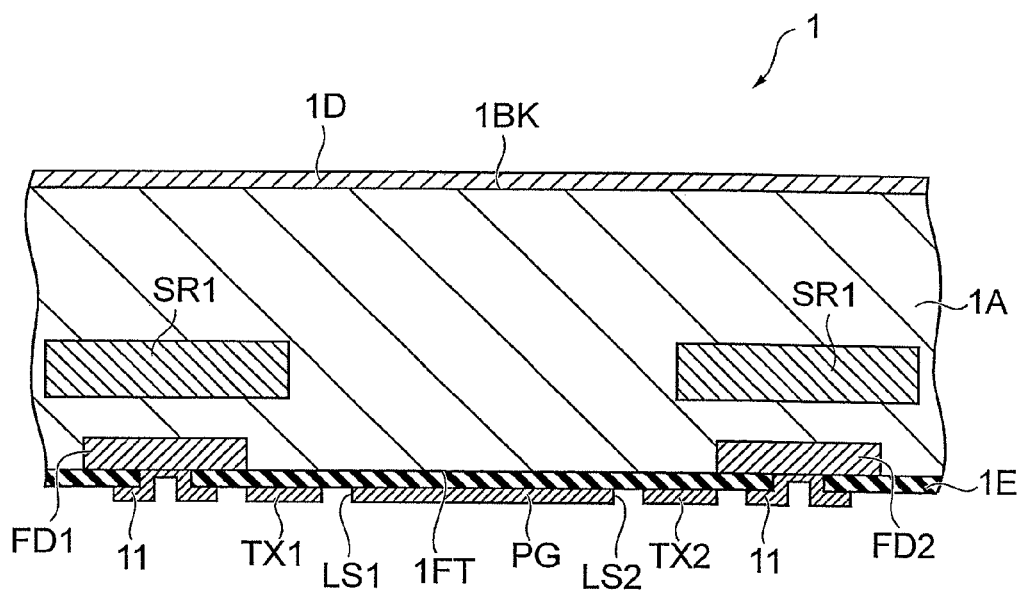
FIG. 5 is a drawing showing a cross-sectional configuration along the line V-V in FIG. 4.

FIG. 4 is a schematic diagram for explaining a configuration of a pixel in the range image sensor. FIG. 5 is a drawing showing a cross-sectional configuration along the line V-V in FIG. 4. In FIG. 4, illustration of conductors 11 is omitted.

The range image sensor 1 is provided with the semiconductor substrate 1A having the light incident surface 1BK and the surface 1FT opposite to the light incident surface 1BK, a photogate electrode PG, first and second gate electrodes TX1, TX2, first and second semiconductor regions FD1, FD2, and third semiconductor regions SR1. The photogate electrode PG is provided through an insulating layer 1E on the surface 1FT. The first and second gate electrodes TX1, TX2 are provided next to the photogate electrode PG through the insulating layer 1E on the surface 1FT. The first and second semiconductor regions FD1, FD2 accumulate respective charges flowing into regions immediately below the respective gate electrodes TX1, TX2. The third semiconductor regions SR1 are located away from the first and second semiconductor regions FD1, FD2 and on the light incident surface 1BK side and have the conductivity type opposite to that of the first and second semiconductor regions FD1, FD2. In the present example the semiconductor substrate 1A is comprised of Si and the insulating layer 1E is comprised of $SiO_2$. The semiconductor substrate 1A may be comprised of an epitaxial layer.

The photogate electrode PG has a rectangular shape on the plan view. In the present embodiment, the photogate electrode PG has a rectangle shape. Namely, the photogate electrode PG has a planar shape having first and second long sides LS1, LS2 opposed to each other, and first and second short sides SS1, SS2 opposed to each other. A region corresponding to the photogate electrode PG in the semiconductor substrate 1A (a region immediately below the photogate electrode PG) functions as a photosensitive region where charge is generated according to incident light. The photogate electrode PG is comprised of polysilicon but may be comprised of another material different from it.

The first semiconductor regions FD1 are arranged on the side where the first long side LS1 of the photogate electrode PG exists and along the first long side LS1. The second semiconductor regions FD2 are arranged on the side where the second long side LS2 of the photogate electrode PG exists and along the second long side LS2. The first semiconductor regions FD1 and the second semiconductor regions FD2 are opposed to each other with the photogate electrode PG in between, in a direction in which the first and second long sides LS1, LS2 are opposed (which will also be sometimes referred to simply as "opposed direction"). The first and second semiconductor regions FD1, FD2 have a rectangular shape on the plan view. In the present embodiment, the first and second semiconductor regions FD1, FD2 have a rectangle shape having the long-side direction parallel to the long-side direction of the photogate electrode PG.

The first gate electrode TX1 is disposed between the photogate electrode PG and the first semiconductor regions FD1. The second gate electrode TX2 is disposed between the photogate electrode PG and the second semiconductor regions FD2. The first and second gate electrodes TX1, TX2 have a rectangular shape on the plan view. In the present embodiment, the first and second gate electrodes TX1, TX2 have a rectangle shape having the long-side direction parallel to the long-side direction of the photogate electrode PG. The lengths in the long-side direction of the first and second gate electrodes TX1, TX2 are set to the same length. The first and second gate electrodes TX1, TX2 are comprised of polysilicon, but may be comprised of another material different from it.

The third semiconductor regions SR1 are located between the first and second semiconductor regions FD1, FD2 and the light incident surface 1BK and are formed so as to cover the first and second semiconductor regions FD1, FD2, when viewed from the direction perpendicular to the light incident surface 1BK. The third semiconductor regions SR1 have a rectangular shape on the plan view. In the present embodiment, the third semiconductor regions SR1 have a rectangle shape having the long-side direction parallel to the long-side direction of the photogate electrode PG.

The semiconductor substrate 1A is comprised of a p-type semiconductor substrate with a low impurity concentration, and the first and second semiconductor regions FD1, FD2 are regions of an n-type semiconductor with a high impurity concentration, which are floating diffusion regions. The third semiconductor regions SR1 are regions having the same conductivity type as the semiconductor substrate 1A and an impurity concentration higher than that of the semiconductor substrate 1A, i.e., regions comprised of a p-type semiconductor with a high impurity concentration. The third semiconductor regions SR1 may be p-type diffusion regions or may be p-type well regions.

The thicknesses/impurity concentrations of the respective semiconductor regions are as described below.
Semiconductor substrate 1A: thickness 5-100 µm/impurity concentration $1\times10^{12}$-$10^{15}$ cm$^{-3}$
First and second semiconductor regions FD1, FD2: thickness 0.1-0.4 µm/impurity concentration $1\times10^{18}$-$10^{20}$ cm$^{-3}$
Third semiconductor regions SR1: thickness 0.5-5 µm/impurity concentration $1\times10^{15}$-$10^{19}$ cm$^{-3}$ The insulating layer 1E is provided with contact holes for exposing the surfaces of the first and second semiconductor regions FD1, FD2. Conductors 11 to connect the first and second semiconductor regions FD1, FD2 to the outside are arranged in the contact holes.

The first and second semiconductor regions FD1, FD2 are partly in contact with the regions immediately below the respective gate electrodes TX1, TX2 in the semiconductor substrate 1A. An antireflection film 1D is provided on the side where the light incident surface 1BK of the semiconductor substrate 1A exists. A material of the antireflection film 1D is $SiO_2$ or SiN.

The wiring board 10 is provided with penetration electrodes (not shown) electrically connected to the first and second semiconductor regions FD1, FD2, the first and second gate electrodes TX1, TX2, the photogate electrodes PG, and others through the bump electrodes and others in the adhesive region AD. The penetration electrodes of the wiring board 10 are exposed in a back surface of the wiring board 10. A light shield layer (not shown) is formed on a surface on the interface side to the adhesive region AD, in an insulating substrate forming the wiring board 10. The light shield layer prevents light transmitted through the range image sensor 1 from entering the wiring board 10. This distance measuring device is constructed so that the aforementioned signals can be supplied to the respective electrodes through respective wires when the range image sensor 1 is mounted on the wiring board 10; therefore, the device is constructed in a compact form.

When a high-level signal (positive potential) is supplied to the first and second gate electrodes TX1, TX2, potentials under the first and second gate electrodes TX1, TX2 become lower than a potential of the region below the photogate electrode PG in the semiconductor substrate 1A. This causes the negative charge (electrons) to be drawn toward the first and second gate electrodes TX1, TX2 and to be accumulated in potential wells formed by the first and second semiconductor regions FD1, FD2. An n-type semiconductor contains a positively ionized donor and has a positive potential, so as to attract electrons. When a low-level (e.g., the ground potential) signal is supplied to the first and second gate electrodes TX1, TX2, the first and second gate electrodes TX1, TX2 generate potential barriers. Therefore, the charge generated in the semiconductor substrate 1A is not drawn into the first and second semiconductor regions FD1, FD2.

In the range image sensor 1, charge generated in the deep semiconductor portion in response to incidence of light for projection is drawn into potential wells provided near the charge generating position on the opposite side to the light incident surface 1BK. This enables fast and accurate distance measurement.

The pulsed light $L_D$ from the object incident through the light incident surface (back surface) 1BK of the semiconductor substrate 1A reaches the region immediately below the photogate electrode PG provided on the front surface side of the semiconductor substrate 1A. The charge generated in the semiconductor substrate 1A with incidence of the pulsed light is distributed from the region immediately below the photogate electrode PG, into the regions immediately below the first and second gate electrodes TX1, TX2 adjacent thereto. Namely, when the detection gate signals $S_1$, $S_2$ synchronized with the drive signal $S_P$ of the light source are alternately supplied through the wiring board 10 to the first and second gate electrodes TX1, TX2, charges generated in the region immediately below the photogate electrode PG flow into the respective regions immediately below the first and second gate electrodes TX1, TX2 and then flow therefrom into the first and second semiconductor regions FD1, FD2.

The ratio of the charge quantity Q1 or Q2 accumulated in the first semiconductor regions FD1 or in the second semiconductor regions FD2, to the total charge quantity (Q1+Q2) corresponds to the phase difference between the emitted pulsed light emitted with supply of the drive signal $S_P$ to the light source and the detected pulsed light returning after reflection of the emitted pulsed light on the object H.

The generation region of charge generated according to incidence of near-infrared light is closer to the front surface 1FT on the opposite side than to the light incident surface 1BK of the semiconductor substrate 1A. For this reason, even if the charge distribution speed is increased by increasing the frequency of the drive signals (detection gate signals $S_1$, $S_2$) to the first and second gate electrodes TX1, TX2, a majority of charge flows from the region immediately below the photogate electrode PG into the first and second semiconductor regions FD1, FD2. Then the accumulated charges Q1, Q2 can be read out through the wires (not shown) of the wiring board 10 from these regions.

The range image sensor 1 is provided with a back gate semiconductor region for fixing the potential of the semiconductor substrate 1A to a reference potential, which is not shown.

Figure 6:
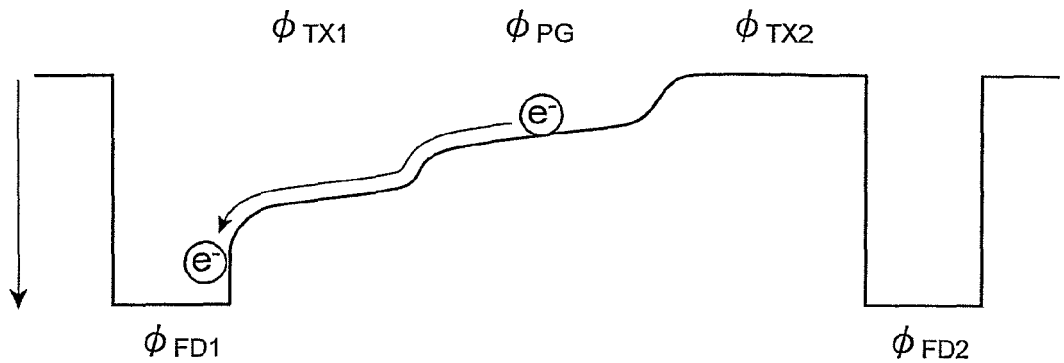
FIG. 6 is a drawing showing potential profiles, for explaining an accumulation operation of signal charge.
Figure 6:
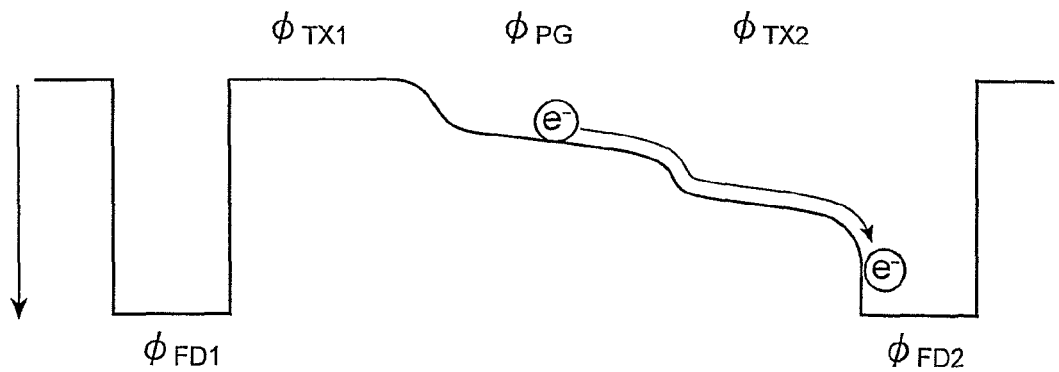

FIG. 6 is a drawing showing potential profiles near the surface 1FT of the semiconductor substrate 1A, for explaining the accumulation operation of signal charge. In FIG. 6, the downward direction is the positive direction of potential.

Upon incidence of light, the potential $\Phi_{PG}$ of the region immediately below the photogate electrode PG is set slightly higher than the substrate potential. In the drawing there are shown the potential $\Phi_{TX1}$ of the region immediately below the first gate electrode TX1, the potential $\Phi_{TX2}$ of the region immediately below the second gate electrode TX2, the potential $\Phi_{FD1}$ of the first semiconductor regions FD1, and the potential $\Phi_{FD2}$ of the second semiconductor regions FD2.

When the high potential of the detection gate signal $S_1$ is fed to the first gate electrode TX1, the charge generated immediately below the photogate electrode PG flows through the region immediately below the first gate electrode TX1 in accordance with a potential gradient to be accumulated in the potential wells of the first semiconductor regions FD1, as shown in FIG. 6 (a). The charge quantity Q1 is accumulated in the potential wells of the first semiconductor regions FD1.

When the high potential of the detection gate signal $S_2$ is fed to the second gate electrode TX2, subsequent to the detection gate signal $S_1$, the charge generated immediately below the photogate electrode PG flows through the region immediately below the second gate electrode TX2 in accordance with a potential gradient to be accumulated in the potential wells of the second semiconductor regions FD2, as shown in FIG. 6 (b). The charge quantity Q2 is accumulated in the potential wells of the second semiconductor regions FD2.

Figure 7:
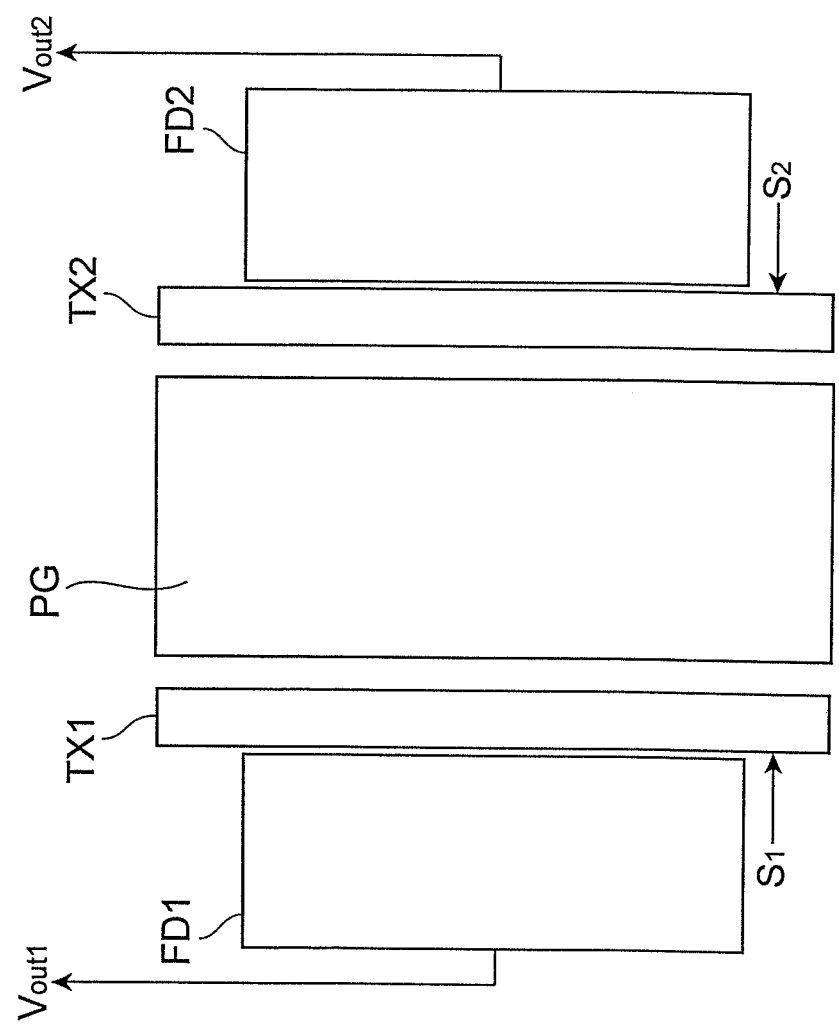
FIG. 7 is a schematic drawing for explaining a configuration of a pixel.

FIG. 7 is a schematic drawing for explaining a configuration of a pixel.

The detection gate signal $S_1$ is supplied to the first gate electrode TX1. The detection gate signal $S_2$ is supplied to the second gate electrode TX2. Namely, the charge transfer signals of different phases are supplied to the first gate electrode TX1 and to the second gate electrode TX2.

When the detection gate signal $S_1$ of the high level is supplied to the first gate electrode TX1, the charge generated in the photosensitive region immediately below the photogate electrode PG flows as signal charge into the potential wells composed of the first semiconductor regions FD1. The signal charge accumulated in the first semiconductor regions FD1 is read out as an output ($V_{out1}$) corresponding to the accumulated charge quantity $Q_1$ from the first semiconductor regions FD1. When the detection gate signal $S_2$ of the high level is supplied to the second gate electrode TX2, the charge generated in the photosensitive region immediately below the photogate electrode PG flows as signal charge into the potential wells composed of the second semiconductor regions FD2. The signal charge accumulated in the second semiconductor regions FD2 is read out as an output ($V_{out2}$) corresponding to the accumulated charge quantity $Q_2$ from the second semiconductor regions FD2. These outputs ($V_{out1}$, $V_{out2}$) correspond to the aforementioned signal d'(m,n).

Figure 8:
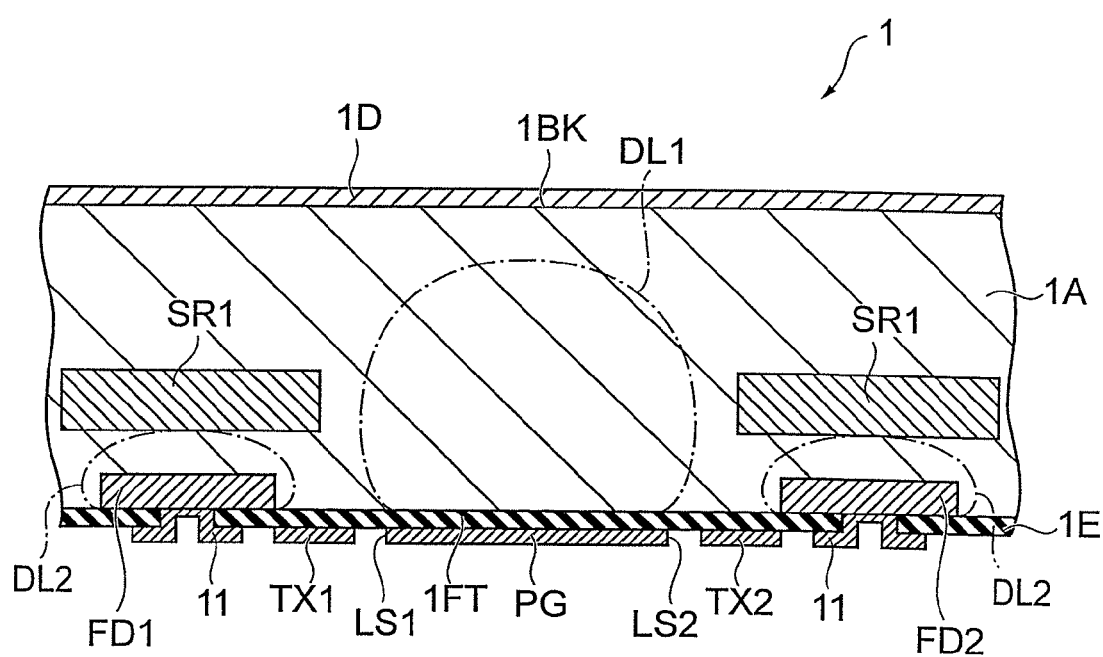
FIG. 8 is a drawing schematically showing the spread of depletion layers.

Incidentally, the range image sensor 1 is configured to apply a bias voltage (e.g., 5 V) to the first and second semiconductor regions FD1, FD2, in order to reset the regions prior to the distance measurement. At this time, depletion layers DL1, DL2, as shown in FIG. 8, spread not only from the region immediately below the photogate electrode PG, but also from the first and second semiconductor regions FD1, FD2.

In the range image sensor 1, however, since the third semiconductor regions SR1 are located away from the first and second semiconductor regions FD1, FD2 and on the light incident surface 1BK side, the depletion layers DL2 spreading from the first and second semiconductor regions FD1, FD2 are prevented from spreading toward the light incident surface 1BK by the third semiconductor regions SR1. Namely, the depletion layers DL2 spreading from the first and second semiconductor regions FD1, FD2 are kept from spreading over the third semiconductor regions SR1 toward the light incident surface 1BK. As a consequence, the generated charge is prevented from being directly taken into the depletion layers DL2 spreading from the first and second semiconductor regions FD1, FD2, which can suppress the generation of the unwanted noise component. Therefore, the range image sensor 1 is able to perform highly accurate distance detection, while suppressing the generation of the unwanted noise component.

An ordinary operation to distribute the charge is to apply a positive high-level detection signal to one gate electrode (e.g., the first gate electrode TX1) out of the first and second gate electrodes TX1 and TX2, and to apply a detection signal with the phase difference of 180° to the other gate electrode (e.g., the second gate electrode TX2). At this time, if the detection signal of a lower level (e.g., the ground potential) is applied to the other gate electrode (e.g., the second gate electrode TX2), the potential immediately below the second gate electrode TX2 is raised to form a potential peak. This makes the charge harder to flow from the photogate electrode PG side to the second semiconductor regions FD2, which can suppress the generation of the unwanted noise component.

Figure 9:
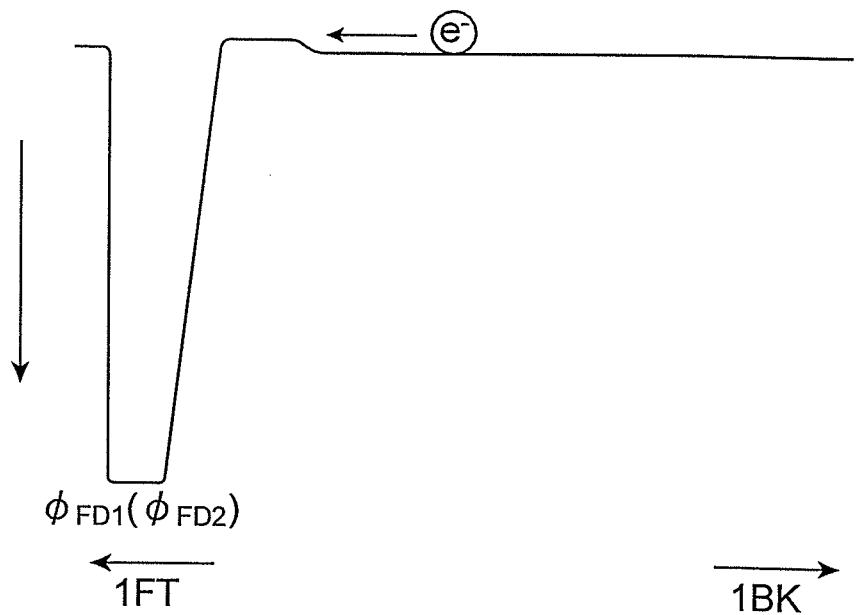
FIG. 9 is a drawing showing a potential profile in the thickness direction of a semiconductor substrate at positions where first and second semiconductor regions are provided.

FIG. 9 is a drawing showing a potential profile in the thickness direction of the semiconductor substrate 1A at the positions of the first and second semiconductor regions FD1, FD2 in the semiconductor substrate 1A. In FIG. 9, the downward direction represents the positive direction of potential. As shown in FIG. 9, because the third semiconductor regions SR1 are provided, there is no potential slope formed from the light incident surface 1BK side to the first and second semiconductor regions FD1, FD2 in the thickness direction of the semiconductor substrate 1A. It can also be understood from this fact that the generated charge is prevented from being directly taken into the depletion layers DL2 spreading from the first and second semiconductor regions FD1, FD2.

Figure 10:
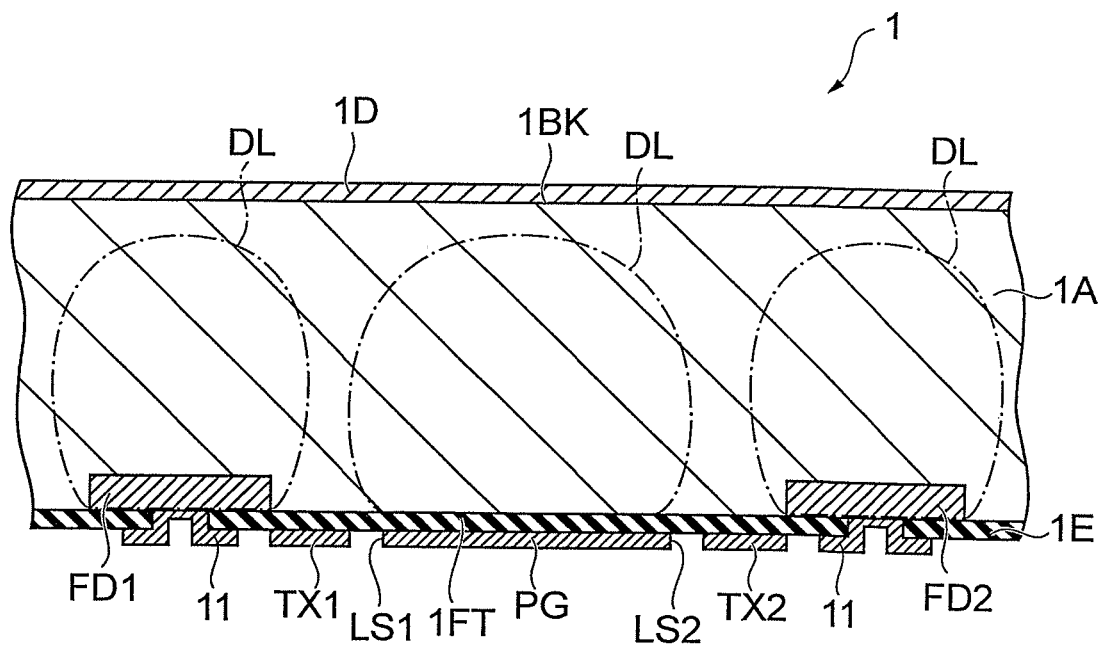
FIG. 10 is a drawing schematically showing the spread of depletion layers.
Figure 11:
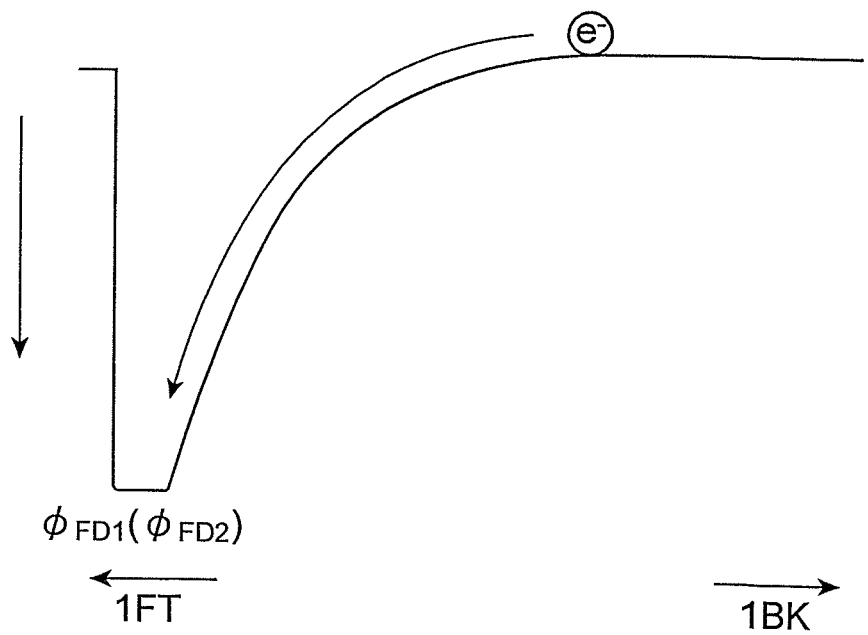
FIG. 11 is a drawing showing a potential profile in the thickness direction of the semiconductor substrate at positions where the first and second semiconductor regions are provided.

On the other hand, if the third semiconductor regions SR1 are not provided, the depletion layers DL spreading from the first and second semiconductor regions FD1, FD2 spread toward the light incident surface 1BK, as shown in FIG. 10, as the depletion layer DL spreading from the photogate electrode PG does. For this reason, as shown in FIG. 11, a potential slope is formed from the light incident surface 1BK side toward the first and second semiconductor regions FD1, FD2 in the thickness direction of the semiconductor substrate 1A and thus the generated charge is directly taken into the depletion layers DL spreading from the first and second semiconductor regions FD1, FD2.

The depletion layer DL1 spreading from the region immediately below the photogate electrode PG is not prevented from spreading by the third semiconductor regions SR1, and thus it spreads toward the light incident surface 1BK, as shown in FIG. 8. Therefore, the third semiconductor regions SR1 do not hinder the capture of charge into the depletion layer DL1 spreading from the region immediately below the photogate electrode PG.

Figure 12:
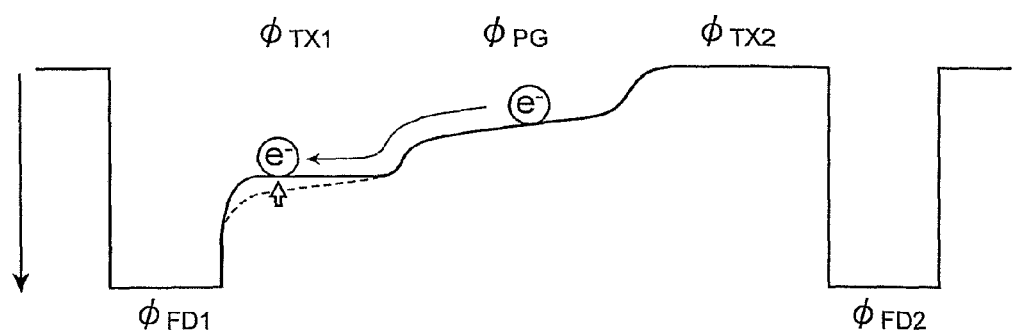
FIG. 12 is a drawing showing potential profiles, for explaining an accumulation operation of signal charge.
Figure 12:
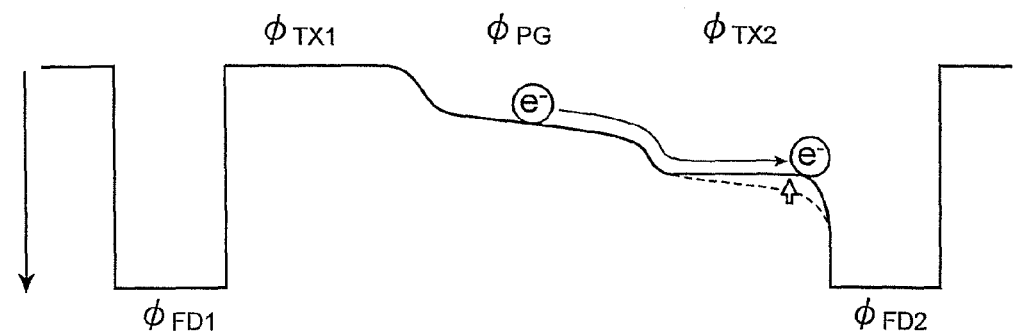

The third semiconductor regions SR1 are located away from the first and second semiconductor regions FD1, FD2. For this reason, there is no barrier formed in the potential slope from the region immediately below the photogate electrode PG to the regions immediately below the first and second semiconductor regions FD1, FD2, and thus there is no hindrance to transfer of charge. In contrast to it, if the third semiconductor regions SR1 are located immediately below the first and second semiconductor regions FD1, FD2, a barrier will be formed in the potential slope from the region immediately below the photogate electrode PG to the regions immediately below the first and second semiconductor regions FD1, FD2, as shown in FIG. 12, so as to hinder the transfer of charge. From the above-described viewpoint, the spacing between the first and second semiconductor regions FD1, FD2 and the third semiconductor regions SR1 in the thickness direction of the semiconductor substrate 1A is preferably set in the distance of 0 to 3 μm.

Figure 13:
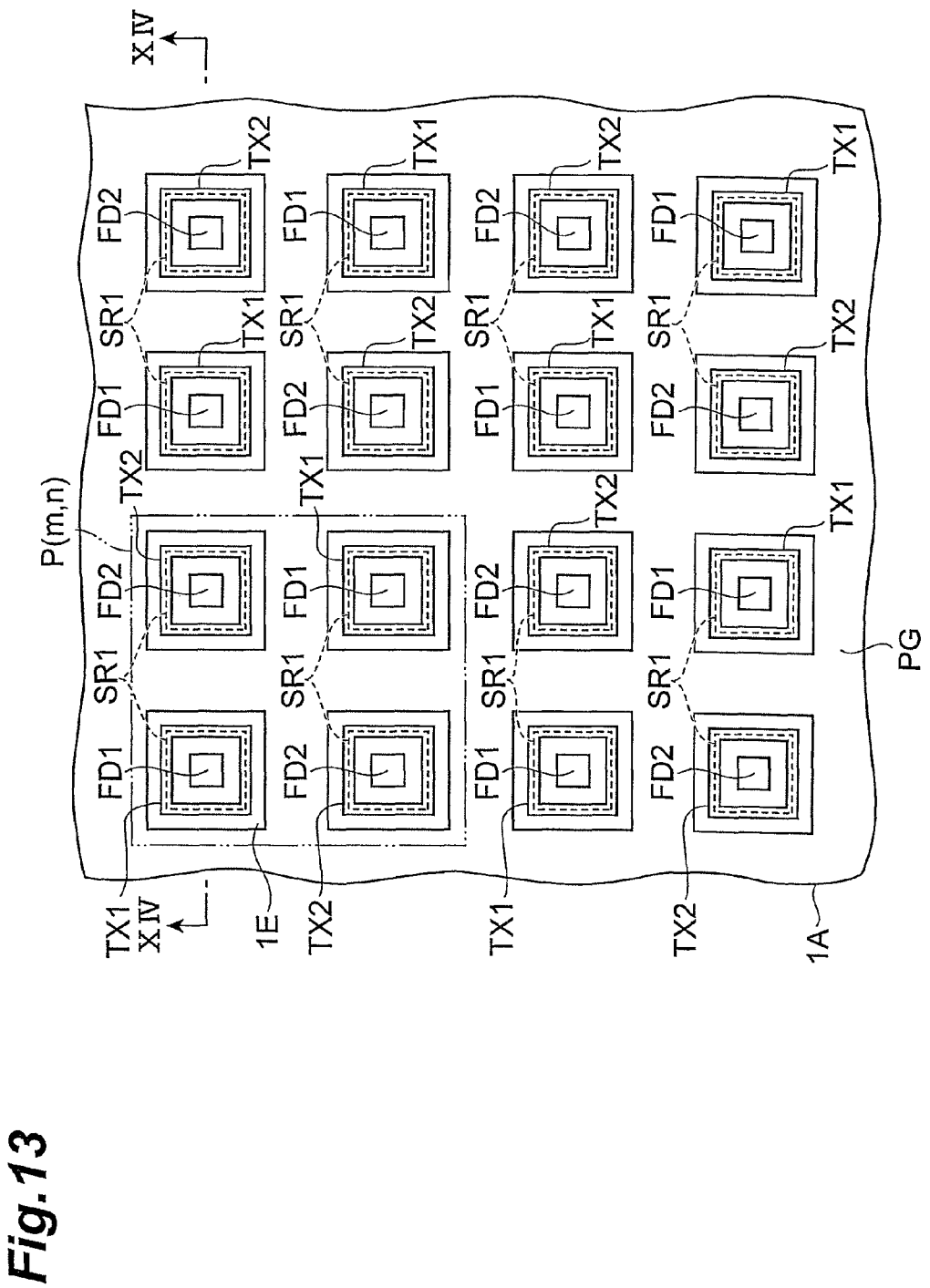
FIG. 13 is a schematic plan view of a modification example of the range image sensor.
Figure 14:
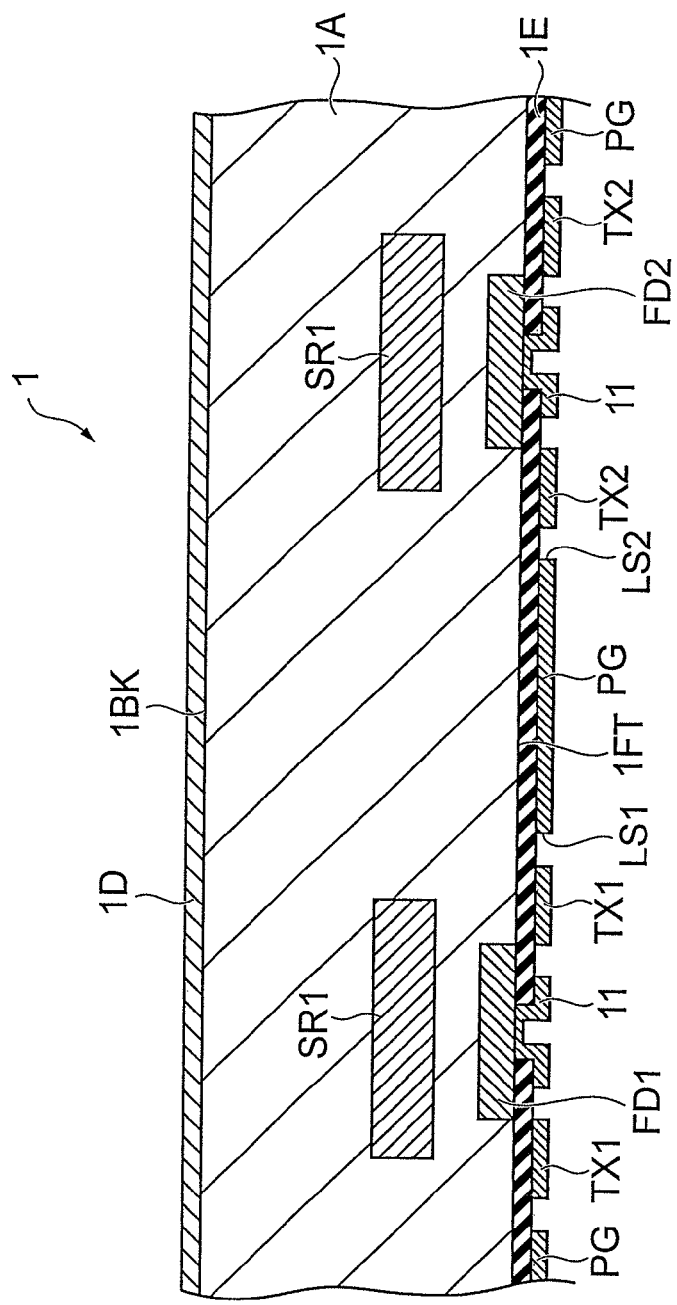
FIG. 14 is a drawing showing a cross-sectional configuration along the line XIV-XIV in FIG. 13.

Next, a modification example of the range image sensor 1 will be described with reference to FIGS. 13 and 14. FIG. 13 is a schematic plan view of the modification example of the range image sensor. FIG. 14 is a drawing showing a cross-sectional configuration along the line XIV-XIV in FIG. 13.

The photogate electrode PG has a grid shape on the plan view. Namely, the photogate electrode PG has electrode portions extending in the X-axis direction and electrode portions extending in the Y-axis direction.

The first semiconductor regions FD1 and the second semiconductor regions FD2 are located so as to be surrounded by the electrode portions extending in the X-axis direction and the electrode portions extending in the Y-axis direction, of the photogate electrode PG. The first semiconductor regions FD1 and the second semiconductor regions FD2 are alternately arranged in the X-direction and the Y-axis direction. In the present modification example, the first and second semiconductor regions FD1, FD2 have a square shape.

The first gate electrode TX1 is provided around the perimeter of each of the first semiconductor regions FD1 so as to surround the first semiconductor region FD1. When viewed in the X-axis direction and in the Y-axis direction, each side of the first gate electrode TX1 is located between the photogate electrode PG and the first semiconductor region FD1. The second gate electrode TX2 is provided around the perimeter of each of the second semiconductor regions FD2 so as to surround the second semiconductor region FD2. When viewed in the X-axis direction and in the Y-axis direction, each side of the second gate electrode TX2 is located between the photogate electrode PG and the second semiconductor region FD2. The first and second gate electrodes TX1, TX2 have a ring shape and in the present modification example they have a rectangular ring shape.

The third semiconductor regions SR1 are located between the first and second semiconductor regions FD1, FD2 and the light incident surface 1BK and, when viewed from the direction perpendicular to the light incident surface 1BK, the third semiconductor regions SR1 are formed so as to cover the whole of the first and second semiconductor regions FD1, FD2. The third semiconductor regions SR1 have a square shape on the plan view.

Figure 15:
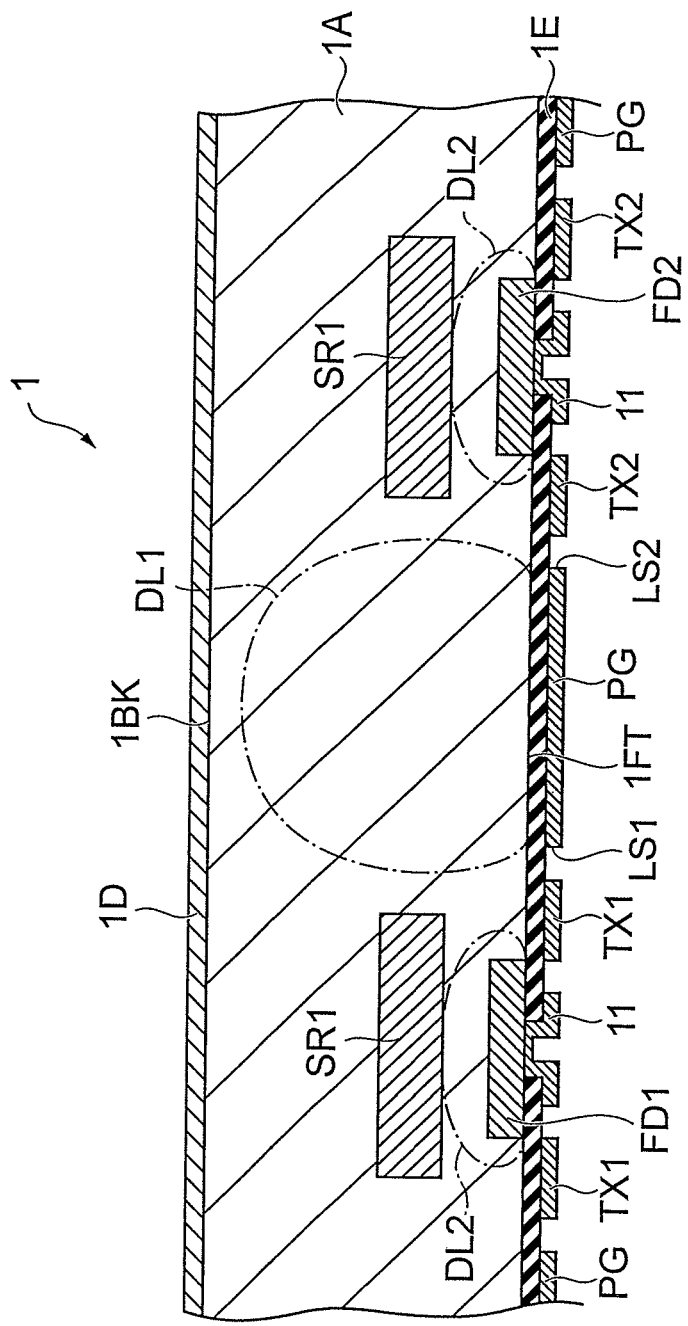
FIG. 15 is a drawing schematically showing the spread of depletion layers.

In the present modification example, as shown in FIG. 15, the depletion layers DL2 spreading from the first and second semiconductor regions FD1, FD2 are also prevented from spreading toward the light incident surface 1BK by the third semiconductor regions SR1. As a consequence, the generated charge is prevented from being directly taken into the depletion layers DL2 spreading from the first and second semiconductor regions FD1, FD2, so as to prevent the generation of the unwanted noise component. Therefore, the present modification example is also able to perform highly accurate distance detection, while preventing the generation of the unwanted noise component.

The above described the preferred embodiments of the present invention, but it should be noted that the present invention is not always limited to the above embodiments but can be modified in many ways without departing from the scope and spirit of the invention.

For example, an allowable configuration is such that a high-concentration layer having the same conductivity type as the semiconductor substrate 1A and an impurity concentration higher than the semiconductor substrate 1A is formed on the light incident surface 1BK side of the semiconductor substrate 1A, and an irregular asperity is formed in the light incident surface 1BK so as to optically expose the light incident surface 1BK. This irregular asperity can be formed by applying a picosecond to femtosecond pulsed laser beam as pulsed laser light to the light incident surface 1BK of the semiconductor substrate 1A.

When the irregular asperity is formed in the light incident surface 1BK of the semiconductor substrate 1A by the method of manufacturing the photodiode according to the present invention, the light incident into the semiconductor substrate 1A is reflected, scattered, or diffused by the region to travel through a long distance in the semiconductor substrate 1A. This causes the light incident into the semiconductor substrate 1A to be mostly absorbed by the semiconductor substrate 1A, without passing through the semiconductor substrate 1A. Therefore, the travel distance of the light incident into the semiconductor substrate 1A becomes long and the distance of absorption of light also becomes long, so as to improve the spectral sensitivity characteristic in the near-infrared wavelength band.

Since the aforementioned high-concentration layer is formed, unnecessary carriers generated irrespective of light on the light incident surface 1BK side are recombined, so as to reduce dark current. The high-concentration layer prevents carriers generated by light near the light incident surface 1BK of the semiconductor substrate 1A from being trapped in the light incident surface 1BK. For this reason, the carriers generated by light efficiently migrate to the photosensitive region, so as to improve the photodetection sensitivity.

INDUSTRIAL APPLICABILITY

The present invention is applicable to the range sensors and range image sensors mounted on product monitors in manufacture lines in factories, vehicles, and so on.

LIST OF REFERENCE SIGNS

1 range image sensor; 1A semiconductor substrate; 1B imaging region; 1BK light incident surface; 1FT surface; DL1, DL2 depletion layers; FD1 first semiconductor regions; FD2 second semiconductor regions; PG photogate electrode; SR1 third semiconductor regions; TX1 first gate electrode; TX2 second gate electrode.

The invention claimed is:

1. A range sensor comprising:
a semiconductor substrate having a first surface and a second surface opposite to the first surface and having a photosensitive region disposed in the first surface side of the semiconductor substrate, the photosensitive region generates charge according to incident light;
a first conductivity type semiconductor region disposed in the first surface side of the semiconductor substrate and configured to accumulate charge generated in the photosensitive region;
an electrode provided on the first surface and configured to transfer charge generated in the photosensitive region to the semiconductor region; and
a second conductivity type semiconductor region located between the first conductivity type semiconductor region and the second surface in the semiconductor substrate and formed so as to cover the first conductivity type semiconductor region, when viewed from the direction perpendicular to the second surface, the second conductivity type semiconductor region has a conductivity type opposite to that of the first conductivity type semiconductor region,
wherein the first conductivity type semiconductor region is provided so as to be surrounded by the photosensitive region.

2. The range sensor according to claim 1,
wherein the electrode is provided around the perimeter of the first conductivity type semiconductor region so as to surround the first conductivity type semiconductor region.

3. A range image sensor comprising an imaging region consisting of a plurality of units arranged in a one-dimensional or two-dimensional pattern, on a semiconductor substrate and configured to obtain a range image, based on charge quantities output from the units,
wherein one said unit is the range sensor as defined in claim 1.

4. The range sensor according to claim 2,
wherein the electrode has a ring shape.

5. The range sensor according to claim 4,
wherein the second conductivity type semiconductor region is arranged so as to cover the whole of the first conductivity type semiconductor region, when viewed from the direction perpendicular to the second surface, and
an entire edge of the second conductivity type semiconductor region overlaps with the electrode, when viewed from the direction perpendicular to the second surface.

* * * * *